(12) United States Patent
Swanson

(10) Patent No.: US 12,137,013 B2
(45) Date of Patent: Nov. 5, 2024

(54) PHASOR IQ DEMODULATION

(71) Applicant: Naval Information Warfare Center Pacific, San Diego, CA (US)

(72) Inventor: Paul David Swanson, Santee, CA (US)

(*) Notice: Subject to any disclaimer, the term of this patent is extended or adjusted under 35 U.S.C. 154(b) by 2 days.

(21) Appl. No.: 17/574,319

(22) Filed: Jan. 12, 2022

(65) Prior Publication Data

US 2023/0224199 A1 Jul. 13, 2023

(51) Int. Cl.
*H04L 27/22* (2006.01)
*H03M 1/12* (2006.01)
*H04L 27/38* (2006.01)

(52) U.S. Cl.
CPC ............ *H04L 27/22* (2013.01); *H03M 1/124* (2013.01); *H04L 27/3881* (2013.01)

(58) Field of Classification Search
CPC ..... H04L 27/22; H04L 27/38; H04L 27/3881; H04L 27/389; H03M 1/124; H03D 3/00; H03D 3/006; H03D 3/007
See application file for complete search history.

(56) References Cited

U.S. PATENT DOCUMENTS

| | | | | |
|---|---|---|---|---|
| 7,307,472 B2 * | 12/2007 | Enguent | ................. | H04L 27/06 329/347 |
| 10,785,075 B2 * | 9/2020 | Dai | ........................ | H03D 3/006 |

* cited by examiner

*Primary Examiner* — Betsy Deppe
(74) *Attorney, Agent, or Firm* — Naval Information Warfare Center, Pacific; Kyle Eppele; Matthew D. Pangallo

(57) ABSTRACT

A method for demodulating an RF signal to polar in-phase and quadrature (IQ) components that includes converting an RF signal with an analog-to-digital converter and calculating the polar in-phase and quadrature (IQ) components of the RF signal as an IQ phasor phase angle and an IQ amplitude using a digital processor. The analog-to-digital converter uses a sampling rate, where, when the sampling rate used has sampling rates other than 3 times an RF carrier frequency of the RF signal, a digital logic circuit splines data to the sampling rate of 3 times the RF carrier frequency of the RF signal. The digital processor calculates the polar in-phase and quadrature (IQ) components of the RF signal as an IQ phasor phase angle and an IQ amplitude using addition, subtraction, multiplication, division, and absolute value.

17 Claims, 17 Drawing Sheets

100 converting an RF signal with an analog-to-digital converter using a sampling rate, wherein, when the sampling rate used has sampling rates other than 3 times an RF carrier frequency of the RF signal, a digital logic circuit splines data to the sampling rate of 3 times the RF carrier frequency of the RF signal — 102 calculating the in-phase and quadrature (IQ) components of the RF signal as an IQ phasor phase angle and an IQ amplitude using a digital processor, wherein the calculations consist of addition, subtraction, multiplication, division, and absolute value — 104

PHASOR IQ DEMODULATION

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND

RF demodulation is the process of extracting a signal containing information from an RF carrier wave. A demodulator generally is an electronic circuit that extracts the signal from the carrier wave. There are many types of demodulators and methods of demodulating a signal from a carrier wave. For example, phase-shift keying is a digital demodulation method that changes the phase of a constant frequency reference signal (i.e., the carrier signal). Some examples of processes that use phase-shift keying include wireless local area networks (LAN), radiofrequency identification (RFID) and Bluetooth communication.

DESCRIPTION OF THE DRAWINGS

Features and advantages of examples of the present disclosure will be apparent by reference to the following detailed description and drawings, in which like reference numerals correspond to similar, but in some instances, not identical, components. Reference numerals or features having a previously described function may or may not be described in connection with other drawings in which they appear.

FIG. 8 shows that the zero value, zero region of F1, F2, F3, F4, F5, and F6 can be used to generate a zero or one indicator specifying which of the 60° zones the current IQ phasor phase angle resides in;

DETAILED DESCRIPTION

Figure 1:
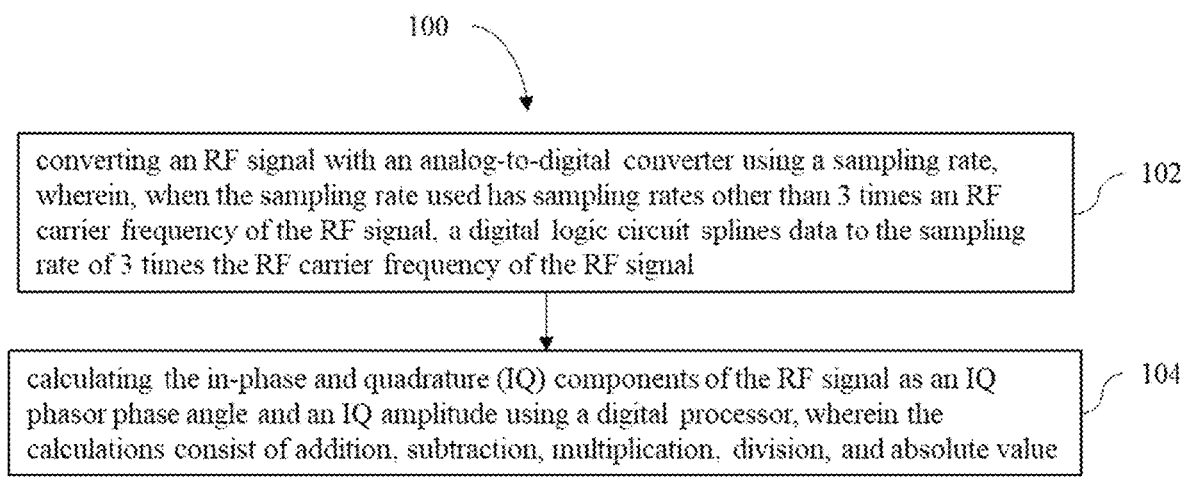
FIG. 1 is a flow diagram illustrating an example of the method for demodulating an RF signal to polar in-phase and quadrature (IQ) components described herein.

Conventional phase shift keyed (PSK) RF receivers demodulate a signal by using analog circuitry to multiply the received signal by a sine and cosine function oscillating at the carrier frequency, recovering (after going through a low pass filter) the In Phase "I" (sine product), and recovering the Quadrature Phase "Q" (cosine product) of the IQ plane phasor defining the "symbol" being transmitted. In an example, a "constellation" of symbols may be a binary 0 or 1 having constant amplitude and a phase difference of 180° to arrays of I and Q values with varying amplitudes and phases to circular patterns of symbols. A large separation of symbols in the IQ plane provide a larger tolerance to amplitude and phase noise. However, the signal-to-noise ratio (SNR) is proportional to the received amplitude, and therefore symbols with a lower amplitude are more vulnerable to error due to noise. In other examples, an RF receiver that demodulates a signal using circular constellations that use a constant amplitude avoid having a symbol dependent error vulnerability. However, RF receivers with circular constellations require more extensive calculations (the arctangent function of I and Q) to determine the symbol value. In addition, current methods of demodulation favor array based symbol arrays because the orthogonal I and Q vectors are the output.

Mathematically, I and Q of a RF signal S is defined by:

$$S(t) = A(t) \cdot \sin[2\pi \text{ft} + \phi(t)]; =$$

$$A(t) \cdot \cos[\phi(t)] \cdot \sin(2\pi \text{ft}) + A(t) \cdot \sin[\phi(t)] \cdot \cos(2\pi \text{ft}); =$$

$$I(t) \cdot \sin(2\pi \text{ft}) + Q(t) \cdot \cos(2\pi \text{ft});$$

$$I(t) = A(t) \cdot \cos[\phi(t)] \text{ and } Q(t) = A(t) \cdot \sin[\phi(t)];$$

the IQ amplitude is $A_{IQ}(t) = \sqrt{[I(t)]^2 + [Q(t)]^2} = A(t);$ the IQ phasor angle is $P_{IQ}(t) = \arctan\left(\frac{Q(t)}{I(t)}\right) = \phi(t).$ The conventional method of extracting the IQ phasor from an RF signal is to determine I(t) and Q(t) by multiplying the signal S(t) by 2·sin(2πft+δ) and 2·sin $$\left(2n \text{ ft} + \frac{\pi}{2} + \delta\right),$$

respectively and filtering out the resulting high frequency 4πft components (note: δ is the phase difference (t−t)·2πf). The use of analog RF mixers (for signal multiplication) and frequency filters add and remove frequency components to the resulting I(t) and Q(t).

The method herein produces the IQ phasor phase angle, IQ amplitude, or a combination of the IQ phasor phase angle and IQ amplitude as the output, which favors circular symbol constellations. The method herein does not require analog local oscillators, mixers, or frequency filters. The IQ phasor phase angle and IQ amplitude can be calculated digitally. The method uses a digital sampling rate of the received signal at 3 times the carrier frequency f (i.e., 3 samples per carrier frequency period). When sampling at 3 times per carrier frequency period, two of any three adjacent sample values will add up to be the negative of the third sampled value. Since each sample is part of 3 sets of 3 samples, random noise can also be removed from the signal by averaging each sample value with each negative sum of the other two sampled values from each set. This feature not only provides a means of removing noise from the signal, but also provides a means of calculating the IQ phasor phase angle and IQ amplitude without the use of trigonometric functions. In addition, the method herein can determine which of the 6 phase regions the IQ phasor phase angle resides in without the use of multiplication or division.

The method herein includes demodulating an RF signal to polar in-phase and quadrature (IQ) components that includes converting an RF signal with an analog-to-digital converter and calculating the polar in-phase and quadrature (IQ) components of the RF signal as an IQ phasor phase angle and an IQ amplitude using a digital processor. The analog-to-digital converter uses a sampling rate, wherein, when the sampling rate used has sampling rates other than 3 times an RF carrier frequency of the RF signal, a digital logic circuit splines data to the sampling rate of 3 times the RF carrier frequency of the RF signal. The digital processor calculates the polar in-phase and quadrature (IQ) components of the RF signal as an IQ phasor phase angle and an IQ amplitude using addition, subtraction, multiplication, division, and absolute value.

Referring now to FIG. 1, the method 100 includes receiving an RF signal with an analog-to-digital converter using a sampling rate of 3 times an RF carrier frequency of the RF signal 102, thereby obtaining 3 adjacent samples per carrier frequency period of the RF signal. When the sampling rate used has sampling rates other than 3 times an RF carrier frequency of the RF signal, a digital logic circuit perform a spline interpolation function to shift the sampling rate to 3 times the RF carrier frequency of the RF signal. Some examples of digital logic circuits include field programmable gate arrays (FPGA) or application-specific integrated circuits (ASIC). In an example, the analog-to-digital converter may be any analog-to-digital converter that is capable of having a variable sampling rate including a sampling rate 3 times the carrier frequency being received and demodulated.

Figure 2:
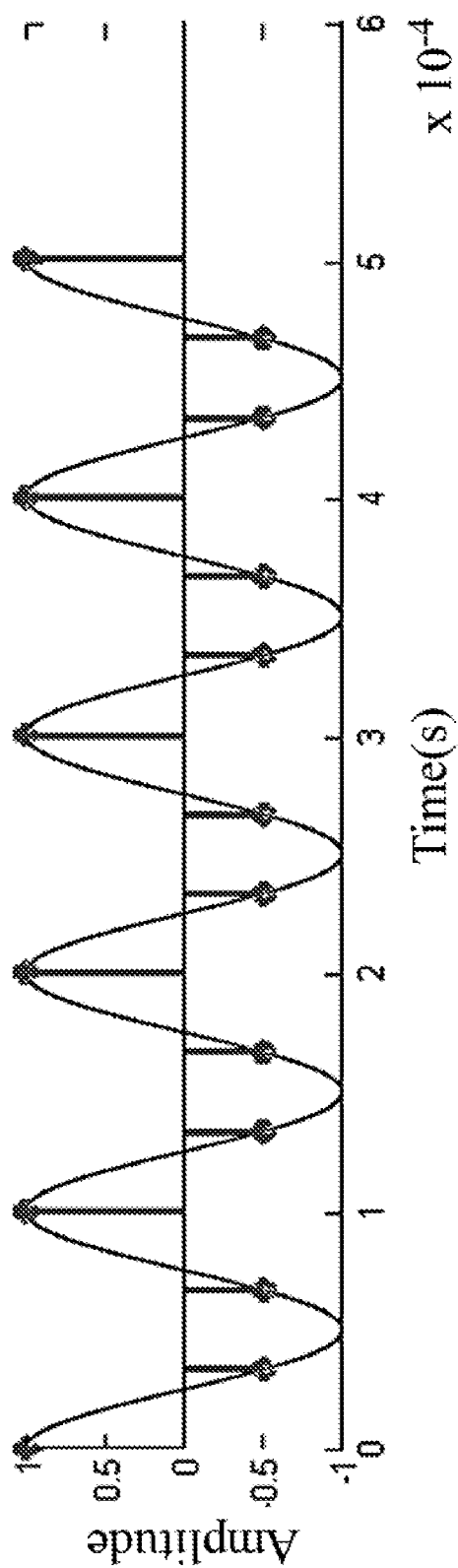
FIG. 2 is an example of a sinewave sample at 3 times per period.
Figure 3:
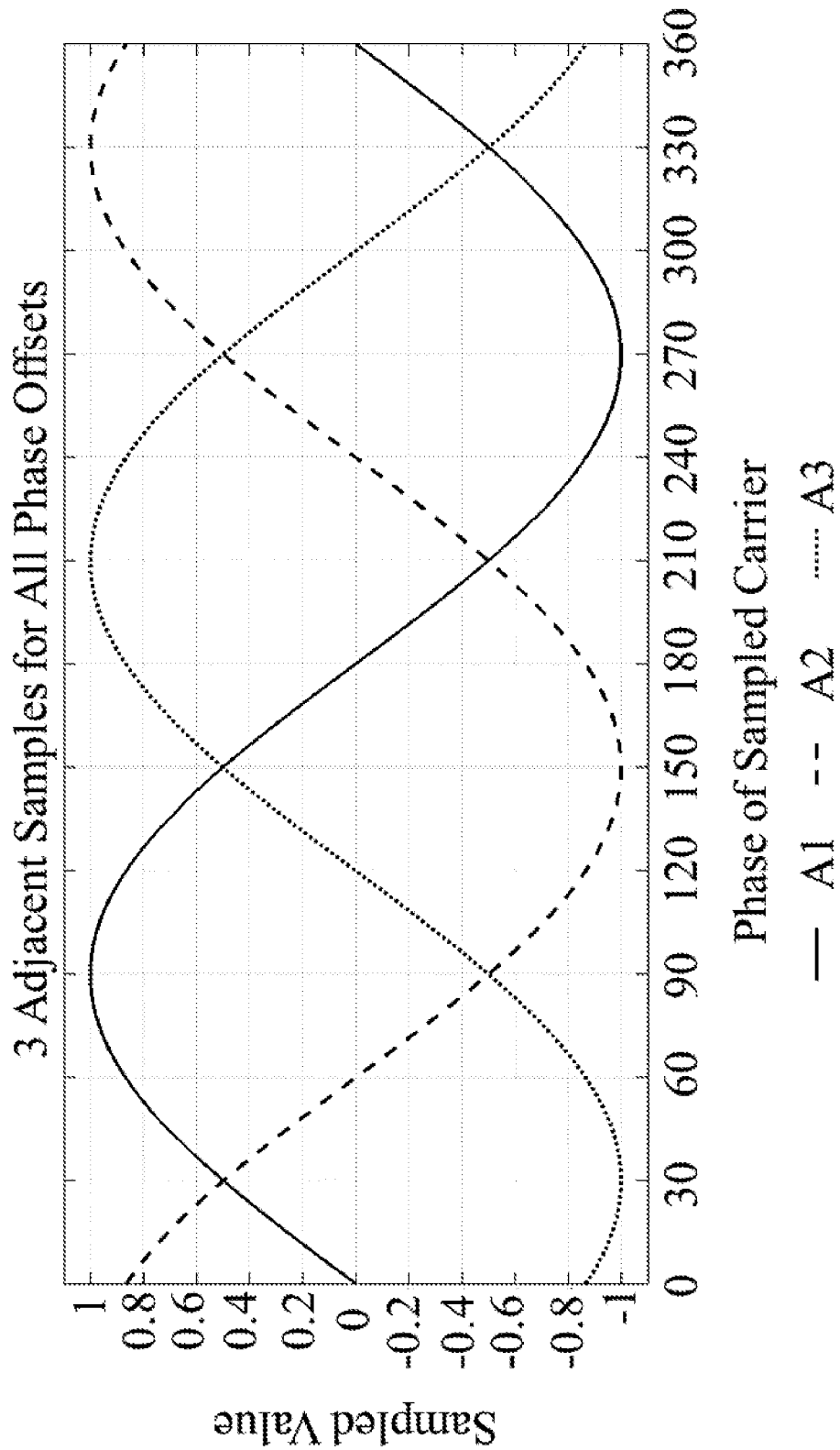
FIG. 3 shows every possible set of 3 samples 120° apart for a unmodulated RF carrier.

Digital logic circuits can perform Boolean logic resulting in addition, subtraction, absolute value, as well as multiplication, division. For example, the digital logic circuit calculations define A1, A2, and A3 as the 3 adjacent samples per carrier frequency period of the RF signal, $S_n$, $S_{n+1}$, and $S_{n-1}$ where S is the RF signal and n is a positive integer provided that 120° is subtracted from ta phase of the RF carrier frequency when n−1 is a multiple of 3 or 120° is added to a phase of the RF carrier frequency when n+1 is a multiple of 3. FIG. 2 shows an example of a sinewave with a sampling rate of 3 times the RF carrier frequency of the RF signal. FIG. 3 shows a plot of every possible set of 3 adjacent samples 120° apart of a unperturbed carrier signal. An amplitude modulation modulates the value of all three samples, while a phase modulation would change the phase of the RF carrier frequency. A frequency shift from the carrier frequency would be the equivalent of phase of the RF carrier frequency linearly increasing (or decreasing) with time.

Referring back to FIG. 1, the method 100 includes calculating the polar in-phase and quadrature (IQ) components of the RF signal as an IQ phasor phase angle, and a IQ amplitude using a digital processor 104. The digital processor performs calculations that consist of addition, subtraction, multiplication, division, and absolute value. Any digital processor may be used that can perform the calculations described herein. Each equation for the calculation is discussed below for the in-phase and quadrature (IQ) components of the RF signal as the IQ phasor phase angle and an IQ amplitude by the digital processor.

First, the calculation of the IQ phasor phase angle is described using the following thirteen equations. The calculation of the Normalization factor, N, at approximately 1.78 times the carrier signal amplitude, is shown below as equation (I):

$$N=(\text{abs}(A1)+\text{abs}(A2)+\text{abs}(A3)+(\text{abs}(A1-A2)+\text{abs}(A1-A3)+\text{abs}(A2-A3))/2)/2 \quad (I)$$

Figure 4:
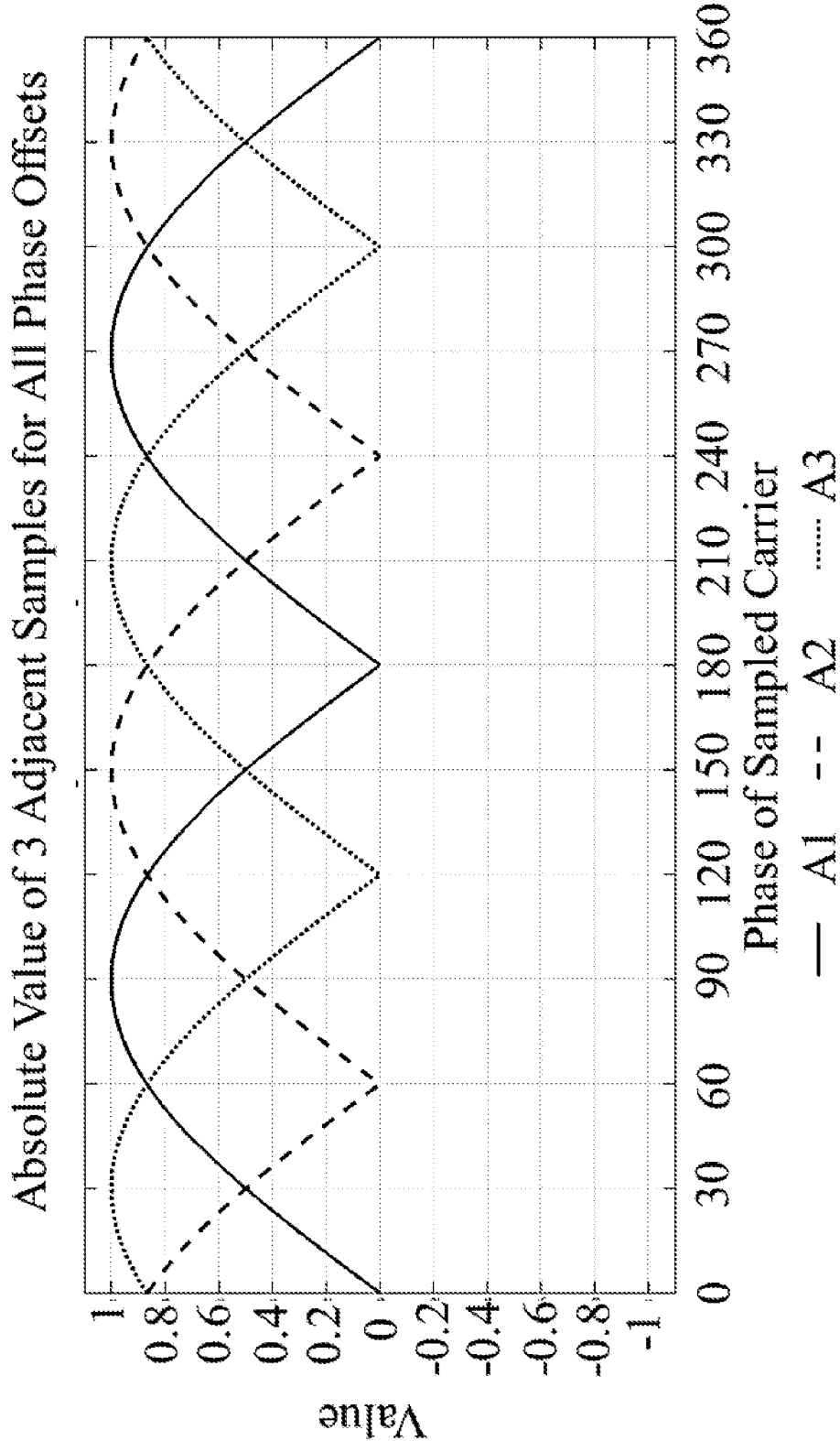
FIG. 4 shows the absolute value of every possible set of 3 samples 120° apart.

First, in equation (I), the absolute value of the 3 adjacent samples per carrier frequency period of the RF signal 120° apart are taken. An example of a plot of the absolute value of 3 samples 120° apart is shown in FIG. 4. Next, the sum of the absolute values for 3 adjacent samples per carrier frequency period of the RF signal 120° apart is taken as shown in equation (I).

Next, the equations (II)-(XIII) are shown below:

$$E1=\text{abs}(A1)+A1-\text{abs}(A2)-A2; \quad (II)$$

$$E2=\text{abs}(A2)-A2-\text{abs}(A3)+A3; \quad (III)$$

$$E3=\text{abs}(A3)+A3-\text{abs}(A1)-A1; \quad (IV)$$

$$E4=\text{abs}(A1)-A1-\text{abs}(A2)+A2; \quad (V)$$

$$E5=\text{abs}(A2)+A2-\text{abs}(A3)-A3; \quad (VI)$$

$$E6=\text{abs}(A3)-A3-\text{abs}(A1)+A1; \quad (VII)$$

$$F1=\text{abs}(A1)-A1+\text{abs}(A2)-A2; \quad (VIII)$$

$$F2=\text{abs}(A2)+A2+\text{abs}(A3)+A3; \quad (IX)$$

$$F3=\text{abs}(A3)-A3+\text{abs}(A1)-A1; \quad (X)$$

$$F4=\text{abs}(A1)+A1+\text{abs}(A2)+A2; \quad (XI)$$

$$F5=\text{abs}(A2)-A2+\text{abs}(A3)-A3; \quad (XII)$$

$$F6=\text{abs}(A3)+A3+\text{abs}(A1)+A1; \quad (XIII)$$

Figure 5A:
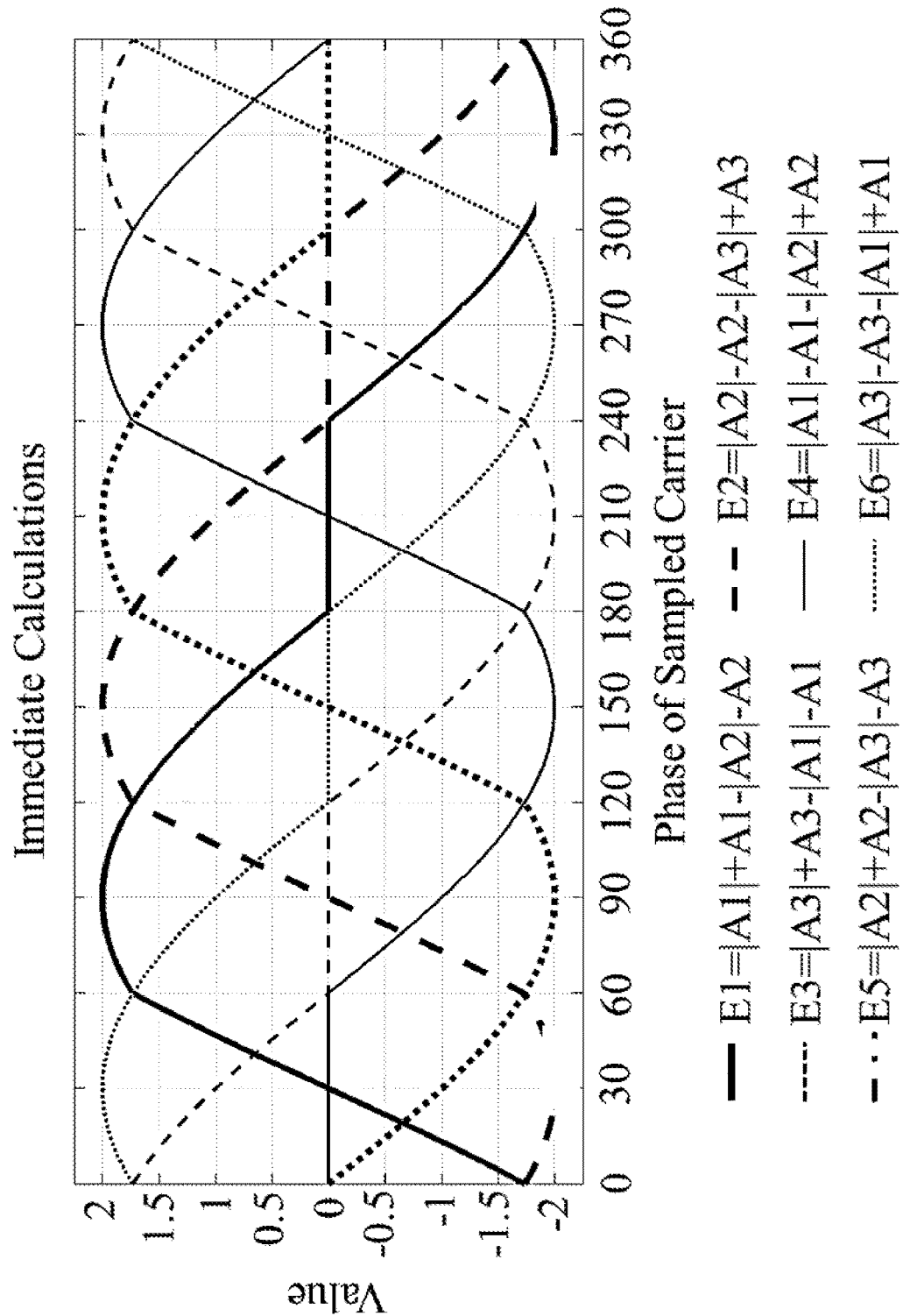
FIG. 5A shows the 6 sets of differences of the sums and differences of the absolute value and value of every possible set of 3 samples 120° apart, with, for every possible set of 3 samples 120° apart, one of the set of 6 calculated values is linearly increasing over a period of ⅙ of the 360°.
Figure 5B:
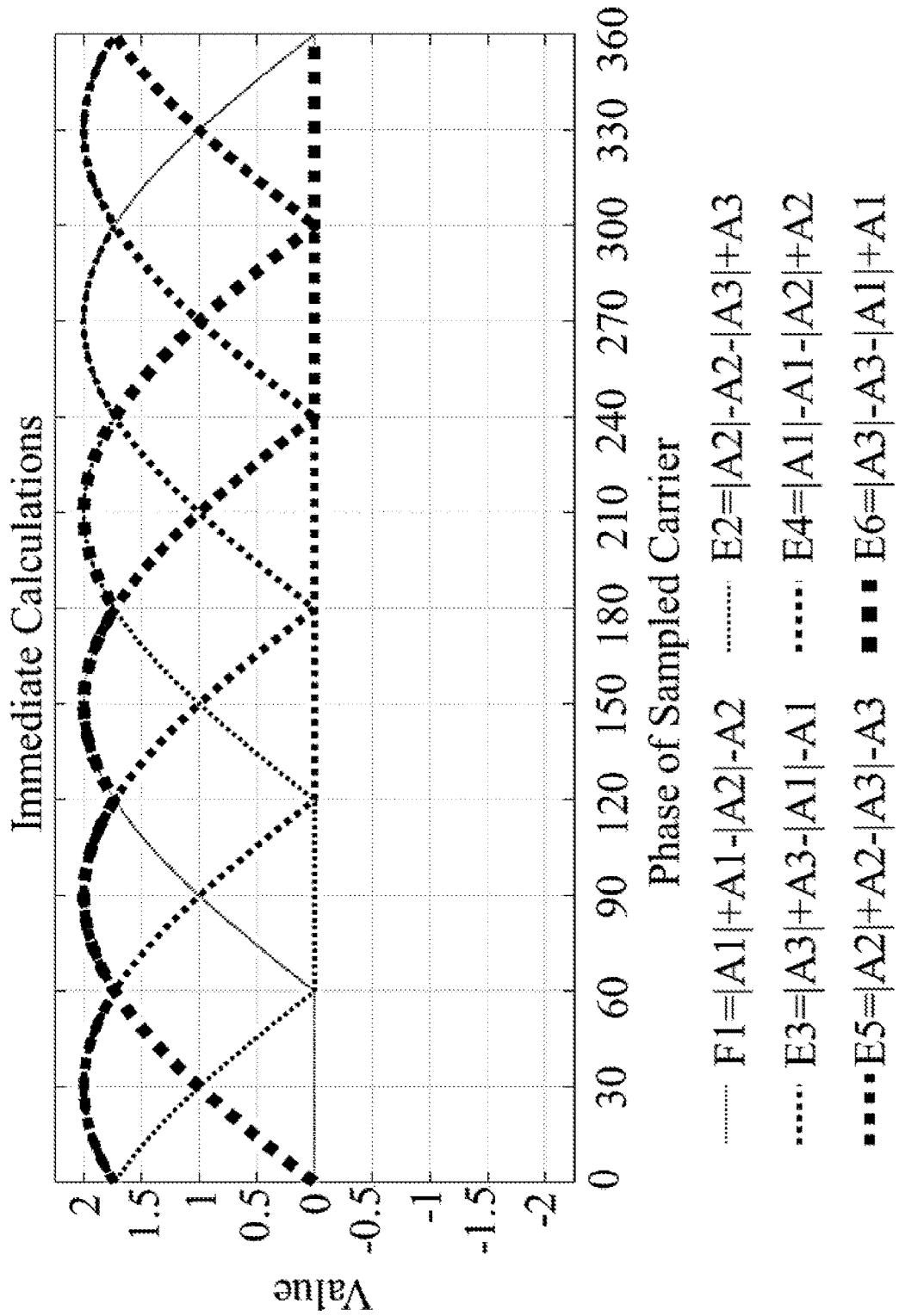
FIG. 5B shows the 6 sets of sums of the sums and differences of the absolute value and value of every possible set of 3 samples 120° apart, with, for every possible set of 3 samples 120° apart, one of the set of 6 calculated values is zero exclusively during a period of ⅙ of the 360°.
Figure 6A:
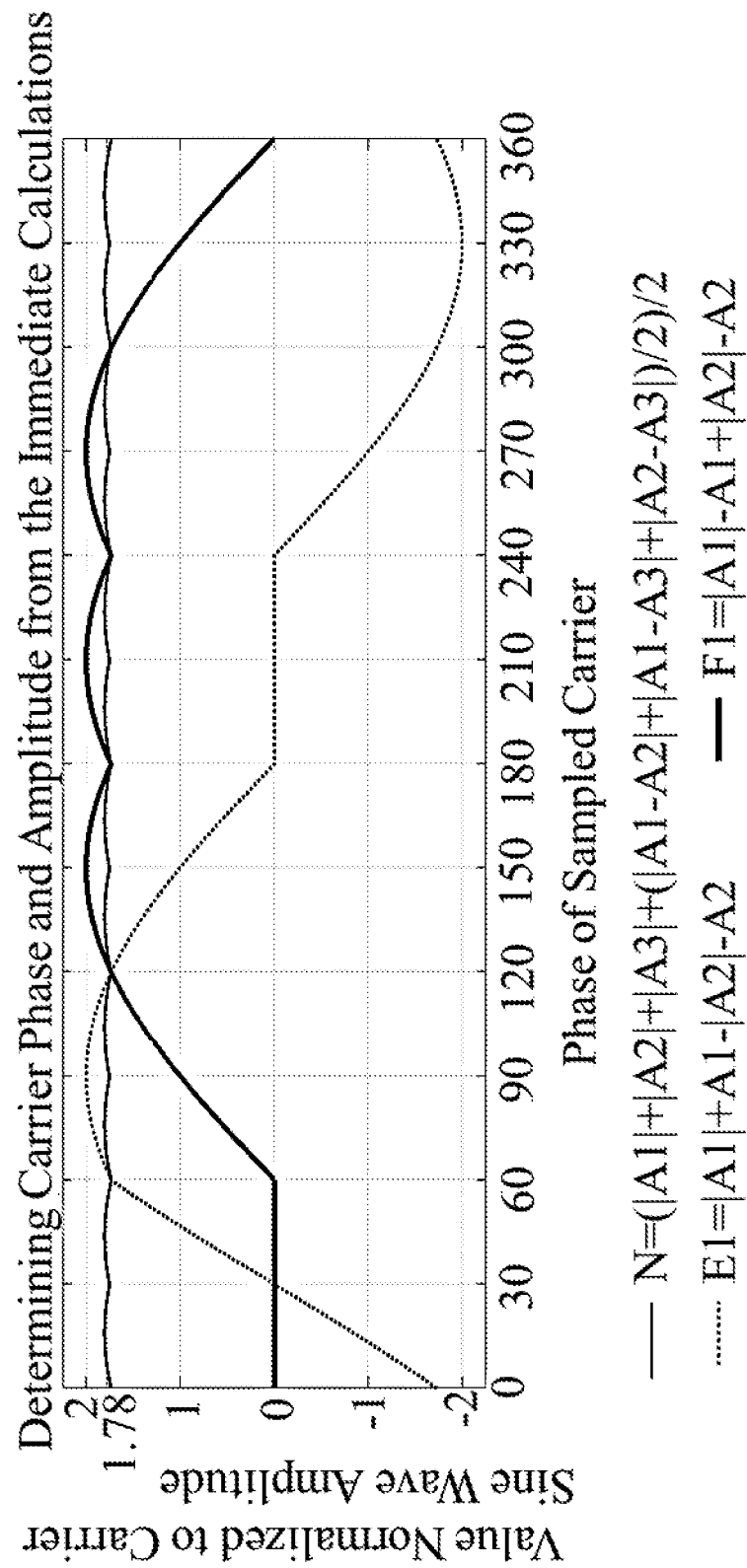
FIG. 6A-6F shows that the zero region of F1, F2, F3, F4, F5, and F6 identify the linear region of E1, E2, E3, E4, E5, and E6 respectively, while the maximum (and minimum) value of the linear regions, +/−N, can be approximately calculated from the set of 3 samples 120° apart.
Figure 6B:
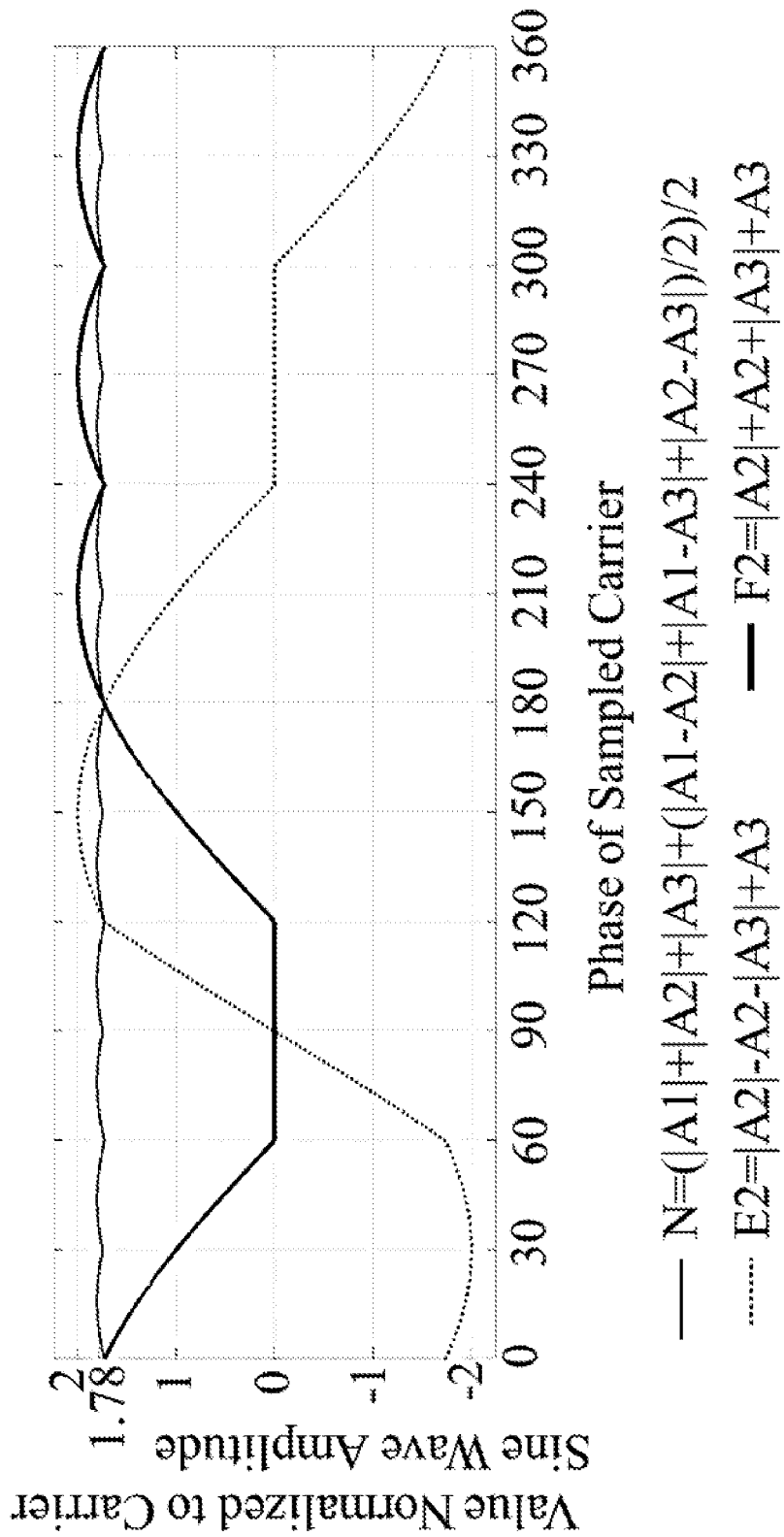
Figure 6C:
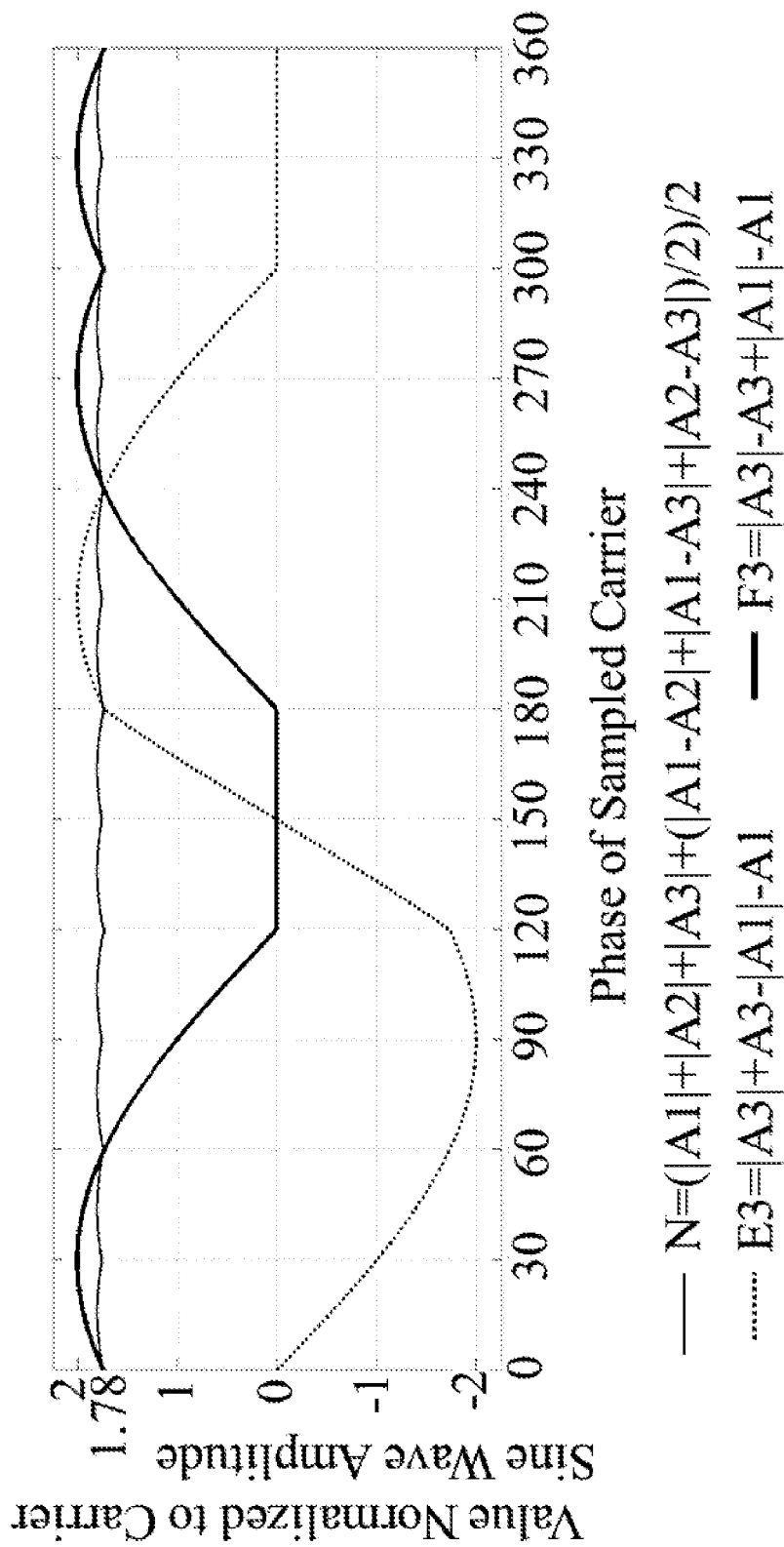
Figure 6D:
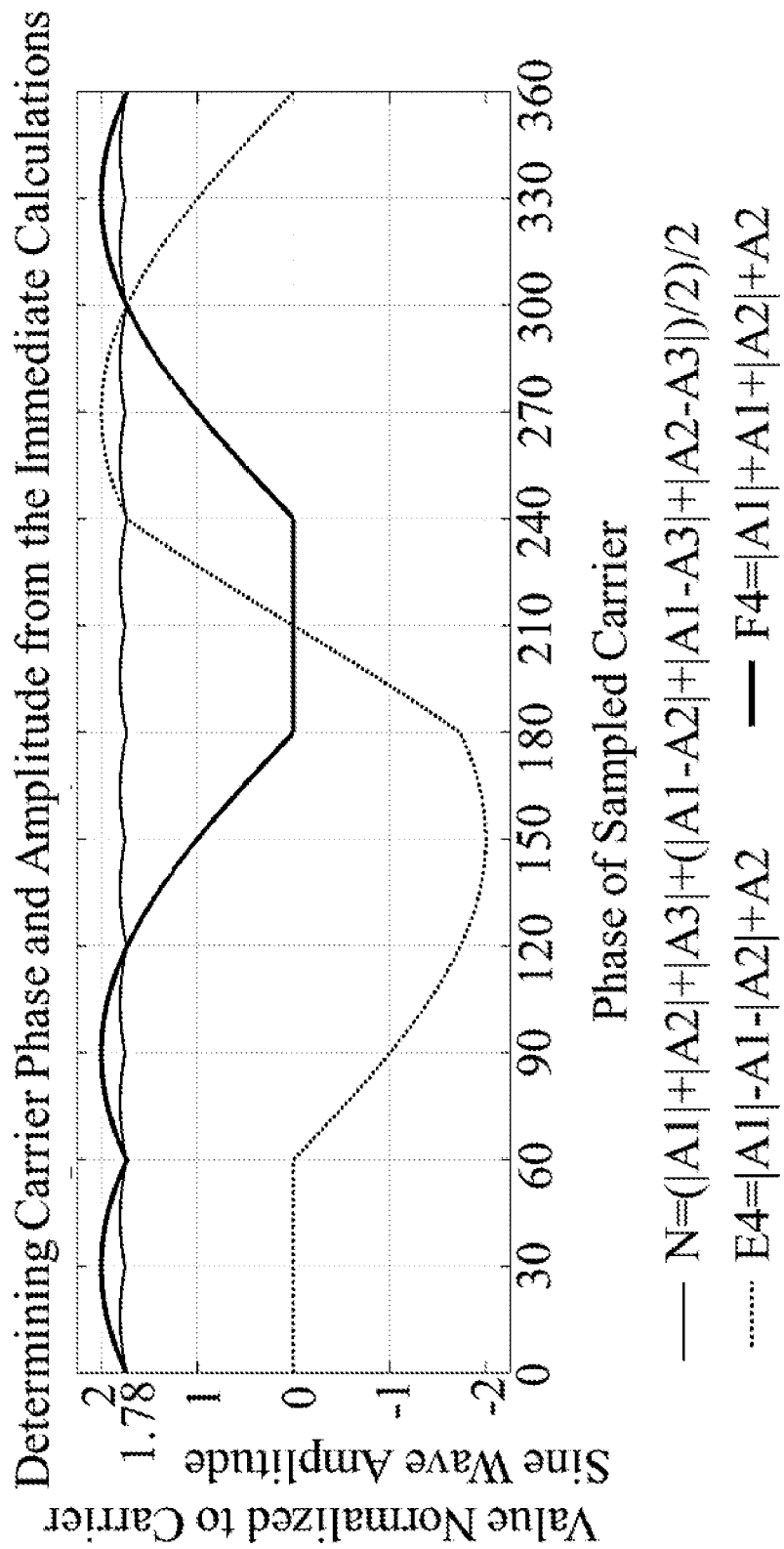
Figure 6E:
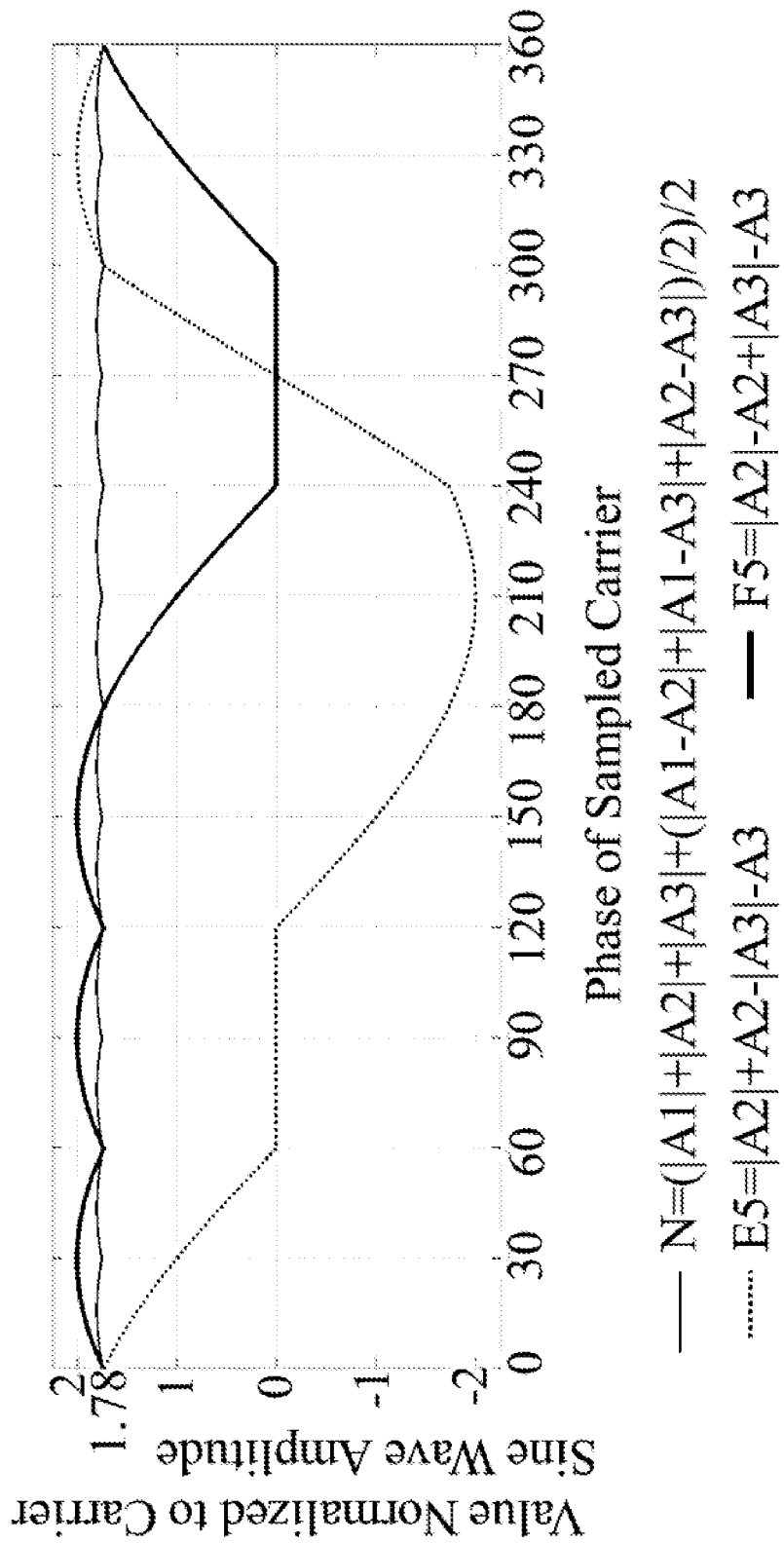
Figure 6F:
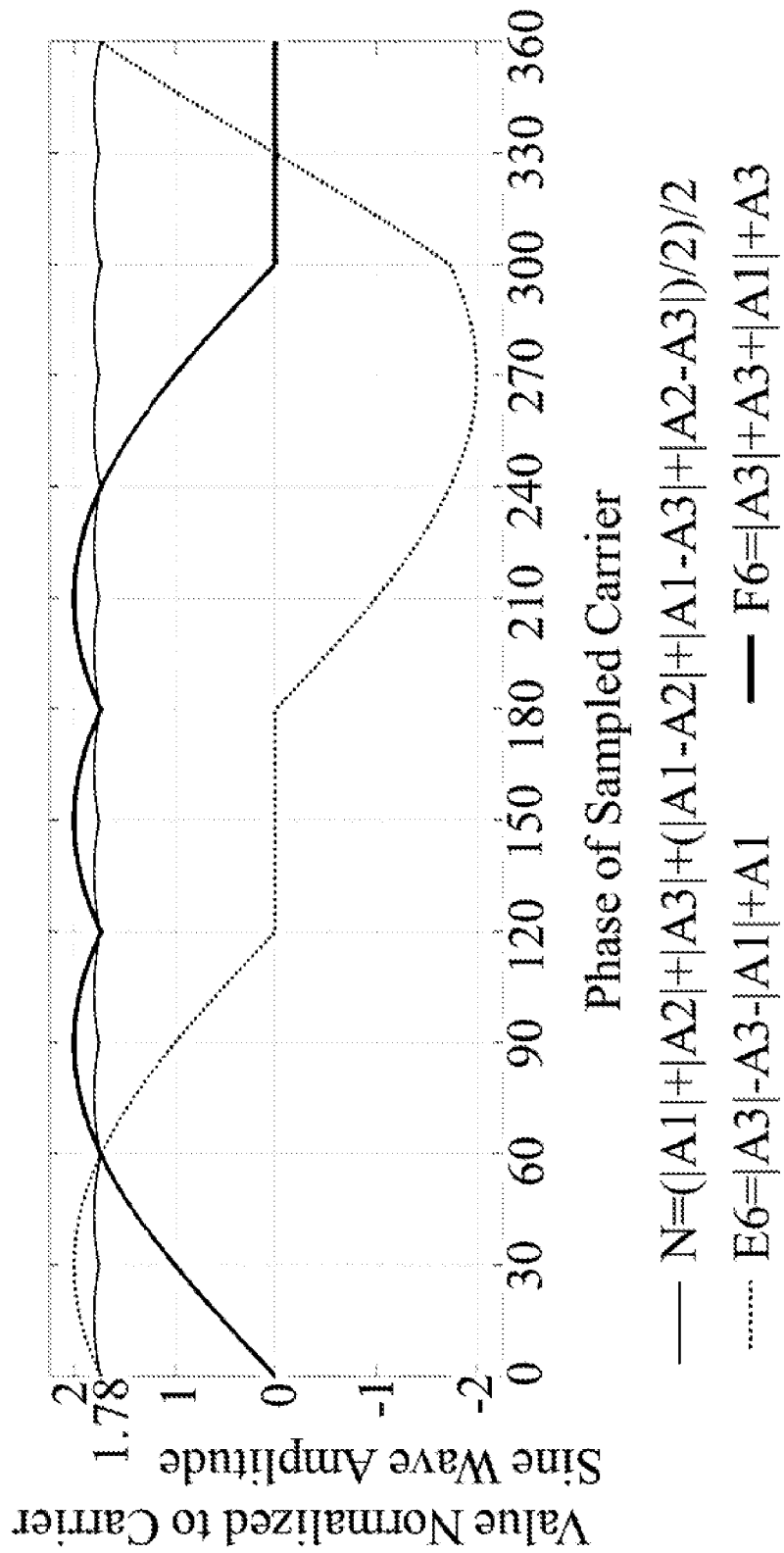

In equations II-VII, E1-E6 are the difference of the sums and the difference of the absolute value and value of the 3 adjacent samples per carrier frequency period of the RF signal 120° apart. In equations VIII-XIII, F1-F6 are the sums of the sums and the difference of the absolute value and value of the 3 adjacent samples per carrier frequency period of the RF signal 120° apart. An example of a plot of the difference of the sums and the difference of the absolute value and value of the 3 adjacent samples per carrier frequency period of the RF signal 120° apart is shown in FIG. 5A. An example of a plot of the sums of the sums and the difference of the absolute value and value of the 3 adjacent samples per carrier frequency period of the RF signal 120° apart is shown in FIG. 5B. FIG. 6A-6F show that equations II-VII each have a 60° linear region and equations VIII-XIII have a 60° zero value region. These calculations can be used by the digital processor to determine the approximate IQ phasor phase angle from the 3 adjacent samples per carrier frequency period of the RF signal (A1, A2, and A3) by means of equation XIV:

$$IQ \text{ Phasor Phase Angle}=(1-\text{sign}(F1))*(30+30*E1/N)+(1-\text{sign}(F2))*(90+30*E2/N)+(1-\text{sign}(F3))*(150+30*E3/N)+(1-\text{sign}(F4))*(210+30*E4/N)+(1-\text{sign}(F5))*(270+30*E5/N)+(1-\text{sign}(F6))*(330+30*E6/N);$$ (XIV)

Figure 7:
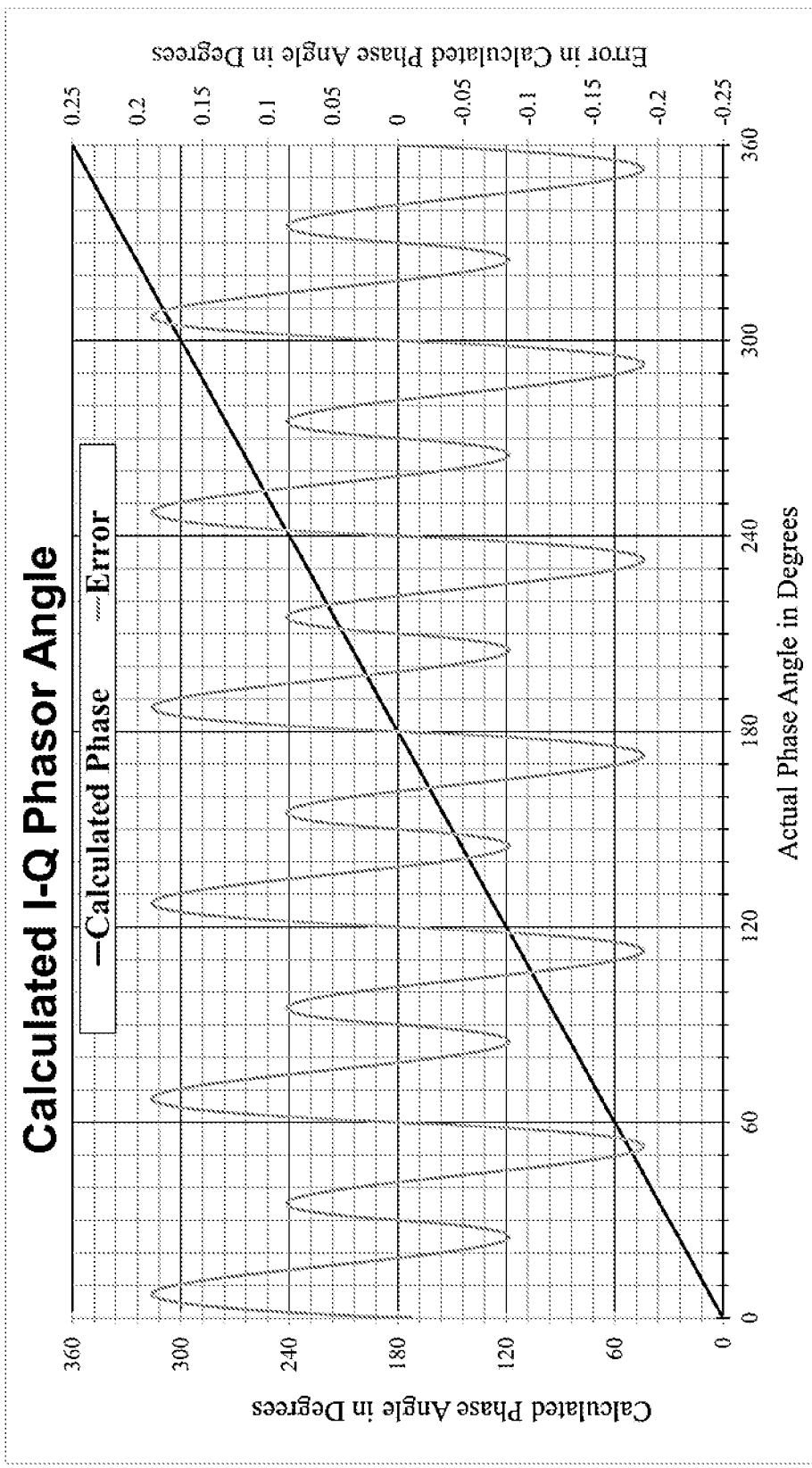
FIG. 7 shows the calculated IQ phasor phase angle for each set of 3 samples 120° apart, using the calculated zone, the corresponding linearly increasing region, and the error in the calculated IQ phasor phase angle due to non-linear regions in the normalized linear regions of E1, E2, E3, E4, E5, and E6.

The calculation of the IQ phasor phase angle for every possible carrier phase from equation (XIV), along with the error from the actual IQ phasor phase angle, is shown in FIG. 7.

Referring back to calculating the polar in-phase and quadrature (IQ) components of the RF signal as an IQ phasor phase angle and an IQ amplitude using a digital processor 104, the IQ amplitude is also calculated before, after, or simultaneously with the IQ phasor phase angle. The IQ amplitude is calculated using the following equation (XV):

$$IQ \text{ Amplitude}=N/1.78$$ (XV)

The IQ amplitude, along with the IQ phasor phase angle, can be used to calculate the polar in-phase component and quadrature component of the RF signal.

In addition, in some examples, the frequency modulation may be determined by the digital processor. The frequency modulation is a difference between a targeted frequency and the actual frequency of the RF signal. The difference between a targeted frequency and the actual frequency of the RF signal, $\Delta F$ (i.e., the frequency modulation), is determined by equation (XVI):

$$\Delta F = (\phi_n - \phi_{n-1}) \frac{F_s}{2\pi}$$ (XVI)

where $\phi_n$ is the IQ phasor phase angle and $F_s$ is the sampling rate.

Figure 8:
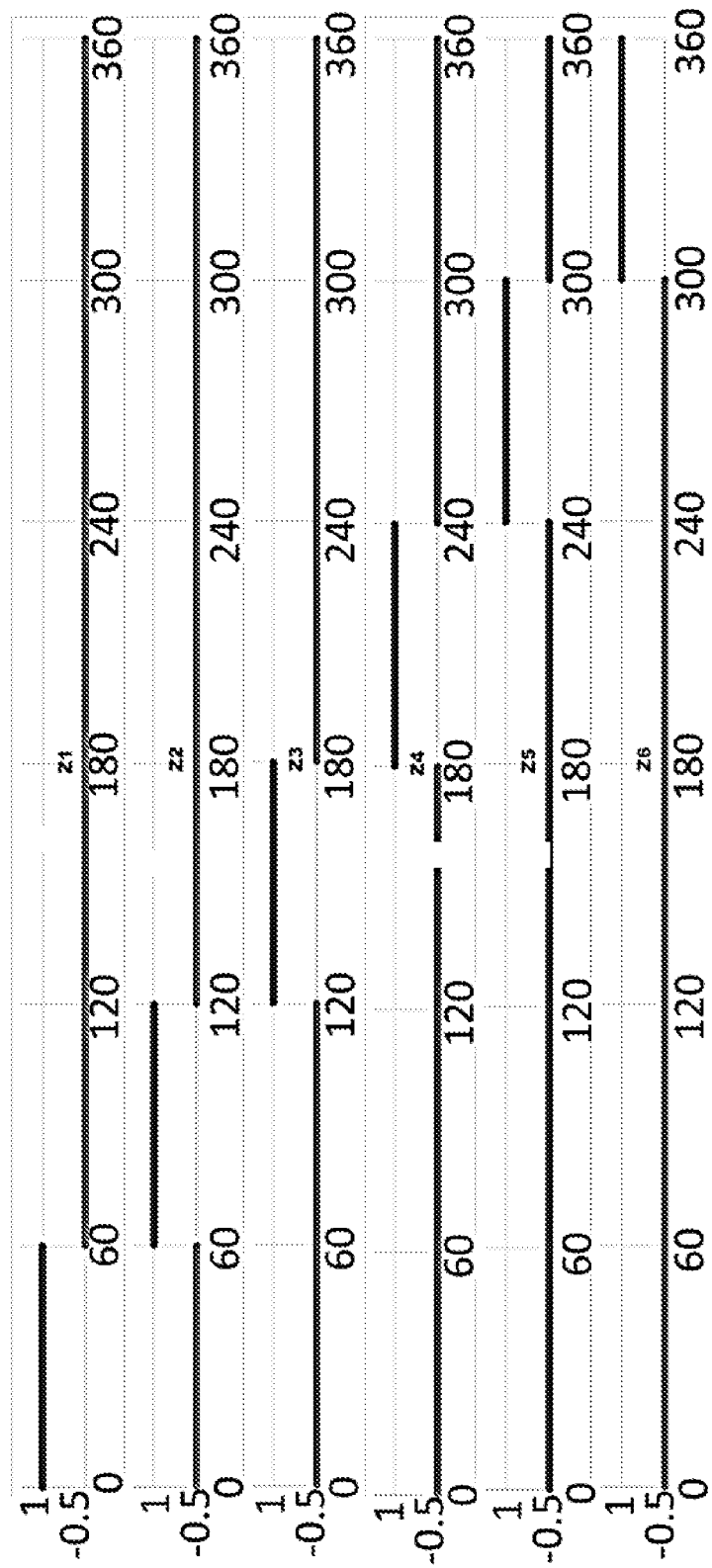

FIG. 8 shows another example of calculations the digital processor can perform that reduces the complexity of the calculations by omitting the use of multiplication or division. For a circular constellation with six or less symbols, the IQ phasor phase angle only needs to be located in one of six 60° zones to identify the symbol. To determine which of the six 60° phase zone (Z1-Z6) the RF signal is in without using multiplication or division, the following six calculations are performed as shown in equations (XVII-XXII):

$$Z1(0°\text{-}60°)=1-\text{sign}(F1);$$ (XVII)

$$Z2(60°\text{-}120°)=1-\text{sign}(F2);$$ (XVIII)

$$Z3(120°\text{-}180°)=1-\text{sign}(F3);$$ (XXIX)

$$Z4(180°\text{-}240°)=1-\text{sign}(F4);$$ (XXX)

$$Z5(240°\text{-}300°)=1-\text{sign}(F5);$$ (XXI)

$$Z6(300°\text{-}360°)=1-\text{sign}(F6);$$ (XXII)

In equations (XVII-XXII), the RF signal is determined to be in the zone (Z1-Z6) when the calculation of one of the zones is equal to 1. This is also shown in FIG. 8 for each zone.

The method 100 herein is continuously performed as long as the RF signal is being received. The IQ phasor phase angle, IQ amplitude, or any additional data being calculated by the digital processor is also continuously forwarded to a computer storage device or a computer for further processing.

Figure 9:
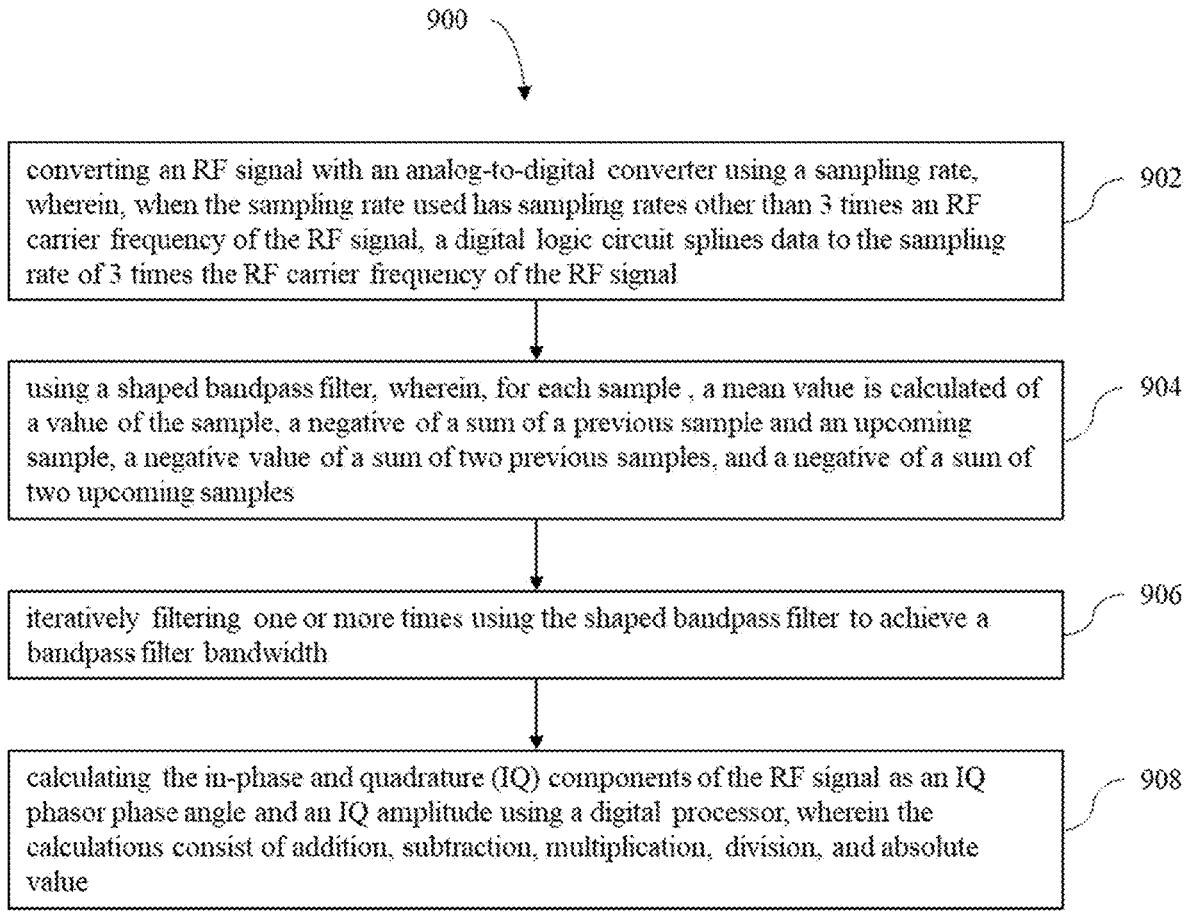
FIG. 9 is a flow diagram illustrating another example of the method for demodulating an RF signal to polar in-phase and quadrature (IQ) components described herein using a shaped bandpass filter.

Referring now to FIG. 9, another example of a method for demodulating an RF signal to polar in-phase and quadrature (IQ) components is shown. The method 900 includes converting an RF signal with an analog-to-digital converter using a sampling rate of 3 times an RF carrier frequency of the RF signal 902. In method 900, the converting an RF signal with an analog-to-digital converter 902 is the same as the converting an RF signal with an analog-to-digital converter 102 of method 100 as previously disclosed herein. The digital logic circuit splines the data to the sampling rate of 3 times the RF carrier frequency of the RF signal as previously disclosed herein when the sampling rate used is a sampling rate other than 3 times the RF carrier frequency of the RF signal.

Referring back to FIG. 9, the method 900 includes using a shaped bandpass filter 904, where, for each adjacent sample per carrier frequency period of the RF signal, a mean value is calculated of a value of the sample, a negative of a sum of a previous sample and an upcoming sample, a negative value of a sum of two previous samples, and a negative of a sum of two upcoming samples. When the shaped bandpass filter is incorporated, the shaped bandpass filter performs calculations after the digital logic circuit, but before the digital processor calculations as shown in FIG. 9.

Figure 10A:
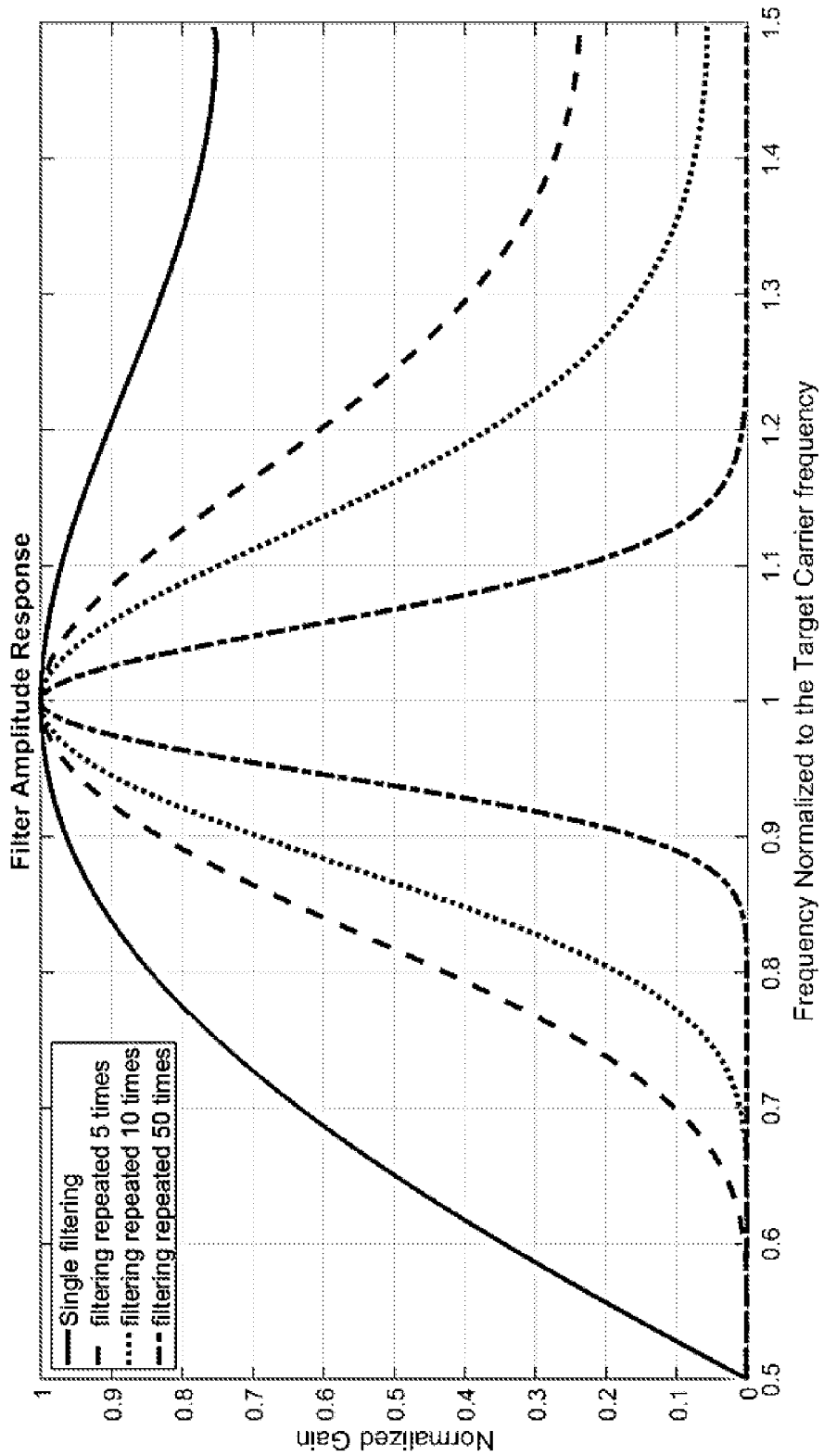
FIG. 10A-10B show the normalized gain and phase shift in frequency space of a shaped bandpass filter for 1, 5, 10, and 50 sequential filter iterations.
Figure 10B:
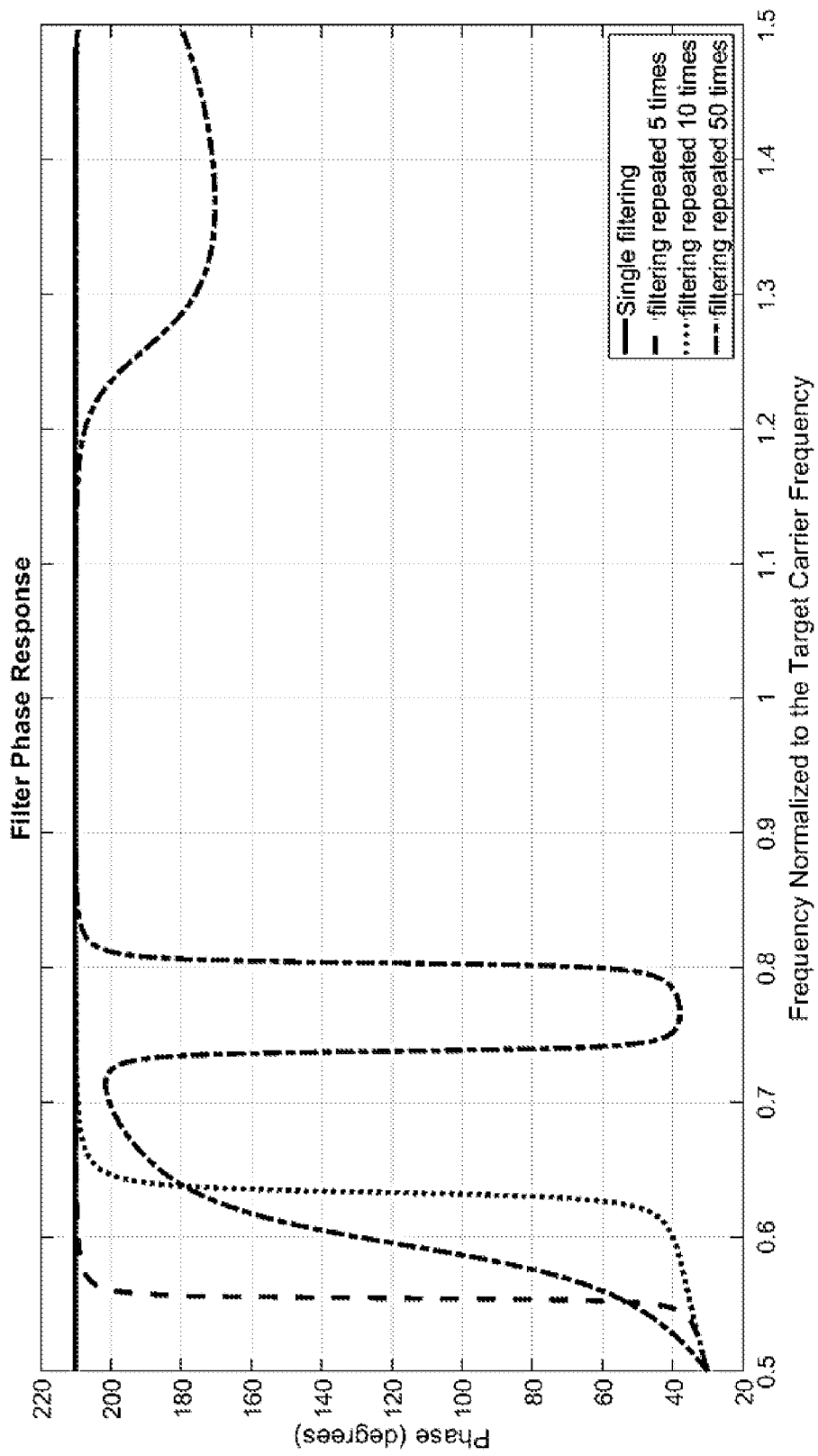

Referring back to FIG. 9, the method 900 includes iteratively filtering one or more times using the shaped bandpass filter to achieve a bandpass filter bandwidth 906. When the desired bandpass filter bandwidth is not achieved after one iteration as previously discussed herein, the filtering can be repeated as many times as necessary to achieve the desired bandpass filter bandwidth. A single iteration of the shaped bandpass filter produces a filtered signal $S'_{(n)}$ according to the equation (XXXIII):

$$S'_{(n)}=[S_{(n)}-[S_{(n+1)}+S_{(n+2)}]-[S_{(n-1)}+S_{(n+1)}]-[S_{(n-1)}+S_{(n-2)}]]/4$$ (XXXIII);

where $S_{(n)}$ is the RF signal and n is a positive integer. Multiple iterations of the filter can be realized by redefining the RF signal $S_{(n)}$ as $S'_{(n)}$. FIGS. 10A and 10B show the frequency response of shaped bandpass filter for 1, 5, 10, and 50 iterations. FIG. 10A shows the frequency normalized to the target carrier frequency on the X-axis and the normalized gain on the Y-axis. FIG. 10B shows the frequency normalized to the target carrier frequency on the X-axis and the phase on the Y-axis.

Referring back to FIG. 9, once the desired bandpass filter bandwidth is achieved, the method 900 further includes calculating the polar in-phase and quadrature (IQ) components of the RF signal as an IQ phasor phase angle and an IQ amplitude using a digital processor 908, where the calculations consist of addition, subtraction, multiplication, division, and absolute value. If multiple iterations of filtering are required to achieve the desired, then repeated filtering occurs until the bandpass filter bandwidth is achieved and then the in-phase and quadrature (IQ) components of the RF signal are calculated 908 as shown in FIG. 9. Calculating the in-phase and quadrature (IQ) components of the RF signal as an IQ phasor phase angle and an IQ amplitude using a digital processor 908 are the same as previously described herein for method 100 of calculating the in-phase and quadrature (IQ) components of the RF signal 104.

In addition to the methods 100, 900, a system for demodulating an RF signal to in-phase and quadrature (IQ) components is disclosed herein. In one example, the system includes an analog-to-digital converter and a digital processer that performs the same functions and calculations as previously disclosed herein. In another example, the system includes an analog-to-digital converter, a digital processer, and a shaped bandpass filter that performs the same functions and calculations as previously disclosed herein.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of a list should be construed as a de facto equivalent of any other member of the same list merely based on their presentation in a common group without indications to the contrary.

Unless otherwise stated, any feature described herein can be combined with any aspect or any other feature described herein.

Reference throughout the specification to "one example", "another example", "an example", means that a particular element (e.g., feature, structure, and/or characteristic) described in connection with the example is included in at least one example described herein, and may or may not be present in other examples. In addition, the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

What is claimed is:

1. A method for demodulating an RF signal to polar in-phase and quadrature (IQ) components, comprising:
    receiving an RF signal with an analog-to-digital converter and converting the RF signal with a sampling rate of 3 times an RF carrier frequency of the RF signal, thereby obtaining 3 adjacent samples per carrier frequency period of the RF signal; and
    calculating the polar in-phase and quadrature (IQ) components of the RF signal as an IQ phasor phase angle and an IQ amplitude using the 3 adjacent samples per frequency period of the RF signal and a digital processor, wherein the IQ phasor phase angle and the IQ amplitude are calculated using addition, subtraction, multiplication, division and absolute value.

2. The method of claim 1, wherein calculating the polar in-phase component of the RF signal as the IQ phasor phase angle using equations (I)-(XIV):

$N = (abs(A1) + abs(A2) + abs(A3) + (abs(A1-A2) + abs(A1-A3) + abs(A2-A3))/2)/2;$ (I)

$E1 = abs(A1) + A1 - abs(A2) - A2;$ (II)

$E2 = abs(A2) - A2 - abs(A3) + A3;$ (III)

$E3 = abs(A3) + A3 - abs(A1) - A1;$ (IV)

$E4 = abs(A1) - A1 - abs(A2) + A2;$ (V)

$E5 = abs(A2) + A2 - abs(A3) - A3;$ (VI)

$E6 = abs(A3) - A3 - abs(A1) + A1;$ (VII)

$F1 = abs(A1) - A1 + abs(A2) - A2;$ (VIII)

$F2 = abs(A2) + A2 + abs(A3) + A3;$ (IX)

$F3 = abs(A3) - A3 + abs(A1) - A1;$ (X)

$F4 = abs(A1) + A1 + abs(A2) + A2;$ (XI)

$F5 = abs(A2) - A2 + abs(A3) - A3;$ (XII)

$F6 = abs(A3) + A3 + abs(A1) + A1;$ (XIII)

$IQ\ Phasor\ Phase\ Angle = (1-sign(F1))*(30+30*E1/N)+(1-sign(F2))*(90+30*E2/N)+(1-sign(F3))*(150+30*E3/N)+(1-sign(F4))*(210+30*E4/N)+(1-sign(F5))*(270+30*E5/N)+(1-sign(F6))*(330+30*E6/N);$ (XIV)

where A1, A2, and A3 are the 3 adjacent samples per carrier frequency period of the RF signal, E1-E6 is the difference of the sums and the difference of the absolute value and value of the 3 adjacent samples per carrier frequency period of the RF signal 120° apart, F1-F6 is the sums of the sums and the difference of the absolute value and value of the 3 adjacent samples per carrier frequency period of the RF signal 120° apart, and N is the Normalization Factor.

3. The method of claim 2, wherein calculating the quadrature (IQ) components of the RF signal as the IQ amplitude using:

$IQ\ Amplitude = N/1.78.$

4. The method of claim 2, wherein calculating the polar in-phase and quadrature (IQ) components of the RF signal as an IQ phasor phase angle and an IQ amplitude using the digital processor includes performing additional calculations after the IQ phasor phase angle is calculated including calculating a difference between a targeted frequency and an actual frequency of the RF signal, ΔF, as determined by:

$$\Delta F = (\phi_n - \phi_{n-1}) \frac{F_s}{2\pi}$$

where $\phi_n$ is the IQ phasor phase angle at a $n^{th}$ data point in a series of data points, $\phi_{n-1}$ is the IQ phasor phase angle at a previous $n^{th}$ data point the series of data points, and $F_s$ is the sampling rate.

5. The method of claim 1, wherein calculating the polar in-phase and quadrature (IQ) components of the RF signal as an IQ phasor phase angle and an IQ amplitude using the digital processor includes performing 60° phase zone calculations to calculate the polar in-phase component of the RF signal as the IQ phasor phase angle instead of equation (XIV) to omit multiplication or division calcualtions by calculating the IQ phasor phase angle within one of six 60° phase zones (Z1-Z6) from 0° to 360° using:

$Z1(0°-60°) = 1-sign(F1);$ $Z2(60°-120°) = 1-sign(F2);$ $Z3(120°-180°) = 1-sign(F3);$ $Z4(180°-240°) = 1-sign(F4);$ $Z5(240°-300°) = 1-sign(F5);$ $Z6(300°-360°) = 1-sign(F6);$ where the RF signal is in one of the six 60° phase zones when one of the zones (Z1-Z6) is equal to 1.

6. The method of claim 1, wherein the method is continuously performed, thereby continuously calculating the polar in-phase and quadrature (IQ) components of the RF signal as the IQ phasor phase angle and the IQ amplitude.

7. A method for demodulating an RF signal to polar in-phase and quadrature (IQ) components, comprising:
receiving an RF signal with an analog-to-digital converter and converting the RF signal with a sampling rate of 3 times an RF carrier frequency of the RF signal, thereby obtaining 3 adjacent samples per carrier frequency period of the RF signal;
using a shaped bandpass filter wherein, for each adjacent sample per carrier frequency period of the RF signal, the shaped bandpass filter calculates a mean value of i) the adjacent sample per carrier frequency period of the RF signal, ii) a negative of a sum of a previous adjacent sample per carrier frequency period of the RF signal and an upcoming adjacent sample per carrier frequency period of the RF signal, iii) a negative value of a sum of two previous adjacent samples per carrier frequency period of the RF signal, and iv) a negative of a sum of two upcoming adjacent samples per carrier frequency period of the RF signal, and wherein the shaped band pass filter iteratively filters one or more times; and
calculating the polar in-phase and quadrature (IQ) components of the RF signal as an IQ phasor phase angle and an IQ amplitude using the 3 adjacent samples per frequency period of the RF signal and a digital processor after the shaped bandpass filter, wherein the IQ phasor phase angle and the IQ amplitude are calculated using addition, subtraction, multiplication, division and absolute value.

8. The method of claim 7, wherein a single iteration of the shaped bandpass filter includes performing a single iteration of the shaped bandpass filter that produces a filtered signal $S'_{(n)}$ according to an equation:

$$S'_{(n)}=[S_{(n)}-[S_{(n+1)}+S_{(n+2)}]-[S_{(n-1)}+S_{(n+1)}]-[S_{(n-1)}+S_{(n-2)}]]/4;$$

where $S_{(n)}$ is the RF signal at a $n^{th}$ data point in a series of data points, $S_{(n+1)}$ is the RF signal at a subsequent $n^{th}$ data point in the series of data points, $S_{(n+2)}$ is the RF signal at a second subsequent $n^{th}$ data point in the series of data points, $S_{(n-1)}$ is the RF signal at a previous $n^{th}$ data point in the series of data points, and $S_{(n-2)}$ is the RF signal at a second previous $n^{th}$ data point in the series of data points.

9. The method of claim 7, wherein the method is continuously performed, thereby continuously calculating the polar in-phase and quadrature (IQ) components of the RF signal as the IQ phasor phase angle and the IQ amplitude.

10. A system for demodulating an RF signal to polar in-phase and quadrature (IQ) components, comprising:
an analog-to-digital converter, wherein the analog-to-digital converter receives an RF signal and converts the RF signal using a sampling rate of 3 times the RF carrier frequency of the RF signal, thereby obtaining 3 adjacent samples per carrier frequency period of the RF signal;
a digital processor electronically connected to an analog-to-digital converter, wherein the analog-to-digital converter provides the 3 adjacent samples per carrier frequency period of the RF signal via an electrical connection to the digital processor that calculates the polar in-phase and quadrature (IQ) components of the RF signal using the 3 adjacent samples per carrier frequency period of the RF signal as an IQ phasor phase angle and an IQ amplitude using addition, subtraction, multiplication, division, and absolute value.

11. The system of claim 10, wherein the digital processor calculates the polar in-phase component of the RF signal as IQ phasor phase angle is calculated using equations (I)-(XIV):

$$N=(abs(A1)+abs(A2)+abs(A3)+(abs(A1-A2)+abs(A1-A3)+abs(A2-A3))/2)/2; \quad (I)$$

$$E1=abs(A1)+A1-abs(A2)-A2; \quad (II)$$

$$E2=abs(A2)-A2-abs(A3)+A3; \quad (III)$$

$$E3=abs(A3)+A3-abs(A1)-A1; \quad (IV)$$

$$E4=abs(A1)-A1-abs(A2)+A2; \quad (V)$$

$$E5=abs(A2)+A2-abs(A3)-A3; \quad (VI)$$

$$E6=abs(A3)-A3-abs(A1)+A1; \quad (VII)$$

$$F1=abs(A1)-A1+abs(A2)-A2; \quad (VIII)$$

$$F2=abs(A2)+A2+abs(A3)+A3; \quad (IX)$$

$$F3=abs(A3)-A3+abs(A1)-A1; \quad (X)$$

$$F4=abs(A1)+A1+abs(A2)+A2; \quad (XI)$$

$$F5=abs(A2)-A2+abs(A3)-A3; \quad (XII)$$

$$F6=abs(A3)+A3+abs(A1)+A1; \quad (XIII)$$

$$IQ \text{ Phasor Phase Angle}=(1-\text{sign}(F1))*(30+30*E1/N)+(1-\text{sign}(F2))*(90+30*E2/N)+(1-\text{sign}(F3))*(150+30*E3/N)+(1-\text{sign}(F4))*(210+30*E4/N)+(1-\text{sign}(F5))*(270+30*E5/N)+(1-\text{sign}(F6))*(330+30*E6/N); \quad (XIV)$$

where A1, A2, and A3 are the 3 adjacent samples per carrier frequency period of the RF signal, E1-E6 is the difference of the sums and the difference of the absolute value and value of the 3 adjacent samples per carrier frequency period of the RF signal 120° apart, F1-F6 is the sums of the sums and the difference of the absolute value and value of the 3 adjacent samples per carrier frequency period of the RF signal 120° apart, and N is the Normalization Factor.

12. The system of claim 11, wherein the digital processor calculates the quadrature (IQ) components of the RF signal as the IQ amplitude using:

$$IQ \text{ Amplitude}=N/1.78.$$

13. The system of claim 11, wherein the digital processor performs additional calculations after the IQ phasor phase angle is calculated including calculating a difference between a targeted frequency and an actual frequency of the RF signal, ΔF, determined by:

$$\Delta F = (\phi_n - \phi_{n-1})\frac{F_s}{2\pi}$$

where $\phi_n$ is the IQ phasor phase angle at a $n^{th}$ data point in a series of data points, $\phi_{n-1}$ is the IQ phasor phase angle at a previous $n^{th}$ data point the series of data points, and $F_s$ is the sampling rate.

14. The system of claim 10, wherein the digital logic circuit performs 60° phase zone calculations to calculate the polar in-phase component of the RF signal as the IQ phasor phase angle instead of equation (XIV) to omit multiplication or division calculations by calculating the IQ phasor phase angle within one of six 60° phase zones (Z1-Z6) from 0° to 360° using:

$$Z1(0°-60°)=1-\text{sign}(F1);$$

$$Z2(60°-120°)=1-\text{sign}(F2);$$

$$Z3(120°-180°)=1-\text{sign}(F3);$$

$$Z4(180°-240°)=1-\text{sign}(F4);$$

$$Z5(240°-300°)=1-\text{sign}(F5);$$

$$Z6(300°-360°)=1-\text{sign}(F6);$$

where the RF signal is in one of the six 60° phase zones when one of the zones (Z1-Z6) is equal to 1.

15. The system of claim 10 further including:
a shaped bandpass filter for each adjacent sample per carrier frequency period of the RF signal, wherein the shaped bandpass filter calculates a mean value of i) the adjacent sample per carrier frequency period of the RF signal, ii) a negative of a sum of a previous adjacent sample per carrier frequency period of the RF signal and an upcoming adjacent sample per carrier frequency period of the RF signal, iii) a negative value of a sum of two previous adjacent samples per carrier frequency period of the RF signal, and iv) a negative of a sum of two upcoming adjacent samples per carrier frequency period of the RF signal, and wherein the shaped band pass filter iteratively filters one or more times.

16. The system of claim 15, wherein a single iteration of the shaped bandpass filter produces a filtered signal $S'_{(n)}$ according to the equation:

$$S'_{(n)}=[S_{(n)}-[S_{(n+1)}+S_{(n+2)}]-[S_{(n-1)}+S_{(n+1)}]-[S_{(n-1)}+S_{(n-2)}]]/4;$$

where $S_{(n)}$ is the RF signal at a $n^{th}$ data point in a series of data points, $S_{(n+1)}$ is the RF signal at a subsequent $n^{th}$ data point in the series of data points, $S_{(n+2)}$ is the RF signal at a second subsequent $n^{th}$ data point in the series of data points, $S_{(n-1)}$ is the RF signal at a previous $n^{th}$ data point in the series of data points, and $S_{(n-2)}$ is the RF signal at a second previous $n^{th}$ data point in the series of data points.

17. A method for demodulating an RF signal to polar in-phase and quadrature (IQ) components, comprising:
receiving an RF signal with an analog-to-digital converter and converting the RF signal to data using a sampling rate that is not 3 times an RF carrier frequency of the RF signal;
splining the data with a digital logic circuit to a sampling rate of 3 times the RF carrier frequency of the RF signal, thereby obtaining 3 adjacent samples per carrier frequency period of the RF signal; and
calculating the polar in-phase and quadrature (IQ) components of the RF signal as an IQ phasor phase angle and an IQ amplitude using the 3 adjacent samples per carrier frequency period of the RF signal and a digital processor, wherein the IQ phasor phase angle and the IQ amplitude are calculated using addition, subtraction, multiplication, division, and absolute value.

* * * * *